United States Patent [19]

Fuse

[11] Patent Number: 4,562,451
[45] Date of Patent: Dec. 31, 1985

[54] SEMICONDUCTOR DEVICE HAVING A RESISTOR REGION WITH AN ENHANCED BREAKDOWN VOLTAGE

[75] Inventor: Mamoru Fuse, Tokyo, Japan

[73] Assignee: Nippon Electric Co., Ltd., Tokyo, Japan

[21] Appl. No.: 727,623

[22] Filed: Apr. 30, 1985

Related U.S. Application Data

[63] Continuation of Ser. No. 385,959, Jun. 7, 1982.

[30] Foreign Application Priority Data

Jun. 5, 1981 [JP] Japan ................................ 56-86586

[51] Int. Cl.⁴ ............................................ H01L 29/90
[52] U.S. Cl. ....................................... 357/13; 357/20; 357/48; 357/51; 357/52; 357/47
[58] Field of Search ................... 357/13 U, 20, 48, 51, 357/52, 47

[56] References Cited

U.S. PATENT DOCUMENTS 3,538,398 11/1970 Whiting .......................... 357/13 XR
4,314,269 2/1982 Fujiki ............................ 357/20 XR
4,361,846 11/1982 Tsukuba ................................ 357/20

FOREIGN PATENT DOCUMENTS 0113366 9/1980 Japan ................................ 357/13 U Primary Examiner—Andrew J. James
Assistant Examiner—William A. Mintel
Attorney, Agent, or Firm—Sughrue, Mion, Zinn, Macpeak and Seas

[57] ABSTRACT

The sharp convex corners of a resistor region in a semiconductor body are typically "weak points" at which avalanche breakdowns are prone to occur due to the small space charge regions at such corners and the correspondingly concentrated electric fields. To avoid this an additional region of the same conductivity type is formed in the semiconductor body opposite each convex corner and spaced therefrom a distance such that the space charge region expanding outwardly from a corner zone as the reverse-bias voltage is increased reaches the associated additional region before any breakdown occurs. When the additional region is so reached it also becomes reverse-biased, and the resulting additional space charge region merges with that from the corner zone to provide an additive effect. The shape of the additional region may be complementary to that of the corner zone, or it may be circularly shaped and disposed radially outwardly from the corner zone.

3 Claims, 9 Drawing Figures

SEMICONDUCTOR DEVICE HAVING A RESISTOR REGION WITH AN ENHANCED BREAKDOWN VOLTAGE

This application is a continuation of application Ser. No. 385,959, filed June 7, 1982.

BACKGROUND OF THE INVENTION

The present invention relates to a semiconductor device, and more particularly to a configuration of a resistor region in a high voltage monolithic IC (Integrated Circuit).

A resistor in a bipolar or MOS-type monolithic IC is constructed by an elongated resistor region of one conductivity type formed in a semiconductor region of opposite conductivity type, and electrodes are provided on both ends of the resistor region. The value of the resistor is determined by the sheet resistance, and by the width and length of the resistor region. In order to decrease the number of manufacturing steps, the doping of impurities for forming the resistor region is usually effected simultaneously with the doping of impurities for forming regions of transistors or other elements. In such case, the sheet resistance of the resistor region cannot be determined independently, and therefore a desired resistance value is determined by the width and length of the resistor region.

In a pattern layout of an integrated circuit including resistors and other circuit elements, the resistor region is often defined not in a straight shape but in a bent or angled shape. This is particularly true where the length of the resistor region is required to be long for a high resistance. Furthermore, the electrode contact regions at both ends of the resistor region are formed in a square shape that is wider than the resistor region. The bent portion of the resistor region necessarily has corners and the electrode contact regions at both ends have four corners, respectively.

The resistor region is isolated from the semiconductor region by applying such a potential to the semiconductor layer that a PN-junction formed between the resistor region and the semiconductor region is reverse-biased. Where the semiconductor region is of N-type, a positive potential is applied to the semiconductor region, whereas a negative potential is applied to the semiconductor region where it is of P-type. In order that the resistor region be isolated from the semiconductor region regardless of the signal voltage applied to the resistor region, the highest potential or the lowest potential (normally a power supply voltage) used in the monolithic IC is applied to the semiconductor region depending upon its conductivity type. Accordingly, when a voltage of the opposite polarity to the power supply voltage applied to the semiconductor region or a voltage near the opposite polarity power supply voltage is applied to one end of the resistor region, an intense reverse bias voltage is established between the resistor region and the semiconductor region. Further, in a monolithic IC, such as a high power amplifier, supplied with a power supply voltage of 100 V or higher, the reverse-bias voltage between the resistor region and the semiconductor region becomes more intense.

In the PN-junction formed between the resistor region and the semiconductor region, a straight PN-junction portion as viewed in a plan would not be subjected to an avalanche breakdown even upon the application of an intense reverse-bias voltage. In other words, it has a high breakdown voltage. However, at the four sharp, convex corners of the electrode contact regions of the resistor region and at the similarly sharp corner in the bent portion of the resistor region, the electric field is concentrated because the space charge region of the PN-junction is very thin there. The electric field concentration at these convex corners is accentuated as the radius of curvature of the corners becomes less. For this reason, an avalanche breakdown will occur first at the convex corners. Consequently, the breakdown voltage of the resistor region is determined by the breakdown voltage at the convex corners, which is a limitation in a high voltage monolithic IC.

It should be noted that the breakdown voltage at the inside concave corner is much higher than that at the outside convex corner, and may be higher than that at the straight portion of a PN-junction. This is because the space charge region is thicker there and the electric field is not concentrated. Both concave corner and convex corners are associated with a pair of straight PN-junctions. The space charge region usually extends laterally out into the semiconductor region in which the resistor region is formed. The space charge regions of a pair of straight PN-junctions associated with a concave corner merge with each other to form a thick space charge region at the corner, whereby the electric field is not very concentrated. In contrast, the space charge regions of a pair of straight PN-junctions associated with a convex corner barely contact each other, and therefore the space charge region at such a corner is very thin. Accordingly, the electric field is highly concentrated at a convex corner, resulting in a decreased breakdown voltage.

For the purpose of preventing such lowering of the breakdown voltage, various approaches have been proposed. However, even with any of the proposed approaches, the breakdown voltage cannot be enhanced to a satisfactory extent, or else other shortcomings arise such as an increase in the manufacturing steps and the enlargement of the area occupied by the resistor region.

SUMMARY OF THE INVENTION

It is therefore one object of the present invention to provide a semiconductor device having a resistor region with a sufficiently high breakdown voltage.

Another object of the present invention is to provide a semiconductor device in which the breakdown voltage of a resistor region is enhanced without enlarging the area occupied by the resistor region.

A semiconductor device according to the present invention comprises a semiconductor region of one conductivity type, a resistor region of opposite conductivity type formed in the semiconductor region and having a sharp convex corner, and an additional region of the same conductivity type as the resistor region formed in the semiconductor region at a site opposed to the convex corners of the resistor region and at a distance such that the space charge (or a depletion layer) from the resistor region reaches the additional region.

When the space charge region expands from the straight PN-junction portion near the convex corner of the resistor region and reaches the additional region, the convex corner of the resistor region acquires a composite space charge region including the thin space charge region extending from the convex corner and that extending from the additional region. In other words, in response to the electric field applied to the PN-junction of the resistor region, a space charge region larger than that in the prior art is established at the convex corner of the resistor region. Therefore, the concentration of the electric field at the convex corner is mitigated, with the result that the breakdown voltage is enhanced.

BRIEF DESCRIPTION OF THE DRAWINGS

Other objects, features and advantages of the present invention will become more apparent by reference to the following detailed description taken in conjunction with the accompanying drawings, wherein.

DETAILED DESCRIPTION OF THE PRIOR ART

Figure 1:
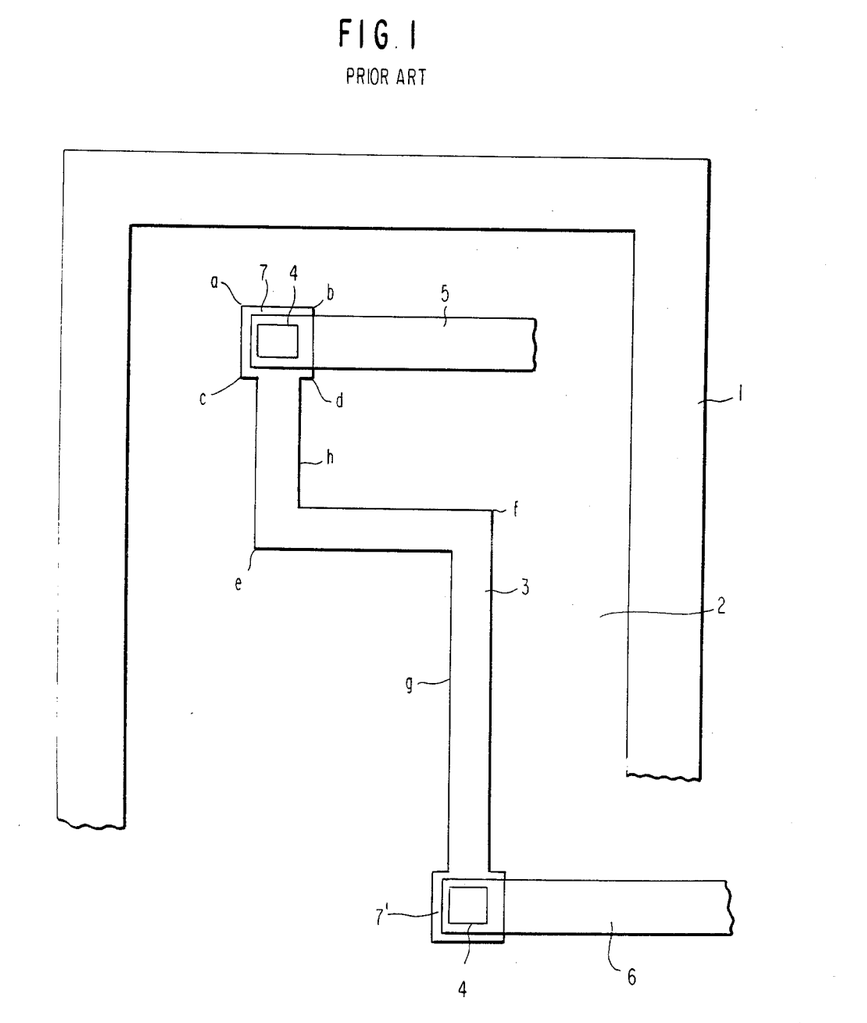
FIG. 1 is a plan view showing a resistor region in a monolithic bipolar IC according to the prior art.

Referring now to FIG. 1 showing a resistor region in a monolithic bipolar IC according to the prior art, an N-type epitaxial layer formed on a P-type semiconductor substrate (not shown) is isolated into a plurality of island regions 2 by an isolation region 1. In one island region is formed a resistor region 3 by diffusing P-type impurities simultaneously with the formation of a base region of an NPN transistor. The resistor region 3 is bent twice substantially at a right angle by the requirements of a pattern layout and its resistor length. In addition, at both ends of the resistor region 3 are formed electrode contact regions 7 and 7', respectively, of a square shape that is broader than the width of the resistor region 3 in order to connect electrodes 5 and 6 of aluminum or the like. Hence, in the illustrated example, the resistor region 3 has two convex corners between the electrode contact regions 7 and 7', and each of the electrode contact regions has four corners.

Contact windows 4 are opened in the surface insulating films on the electrode contact regions 7 and 7', and the electrodes 5 and 6 make contact through the windows. In order to separate the resistor region 3 from the island region, the island region of N-type is biased by the highest potential used in the IC that is, by the positive power supply voltage. The electrode 5 is supplied with the lowest potential used in the IC, that is, the ground potential or the negative power supply voltage, while the electrode 6 is supplied with a signal voltage. Accordingly, the PN-junction between the N-type island region 2 and the P-type regions consisting of the portion of the resistor region 3 near to the electrode 5 and the electrode contact region 7 is intensely reverse-biased by a voltage close to the power supply voltage. Since the other electrode contact region 7' is supplied with the signal voltage, the reverse-bias voltage applied across the PN-junction at the region 7' is not so intense.

The impurity concentration in the resistor region 3 and the electrode contact region 7 is higher than that in the island region 2. Therefore, the space charge region for the PN-junction formed between these regions would expand principally on the side of the island region 2. The radius of curvature at straight PN-junction portions g and h is infinite, whereas that at the convex corners a to f is extremely small. Therefore, the space charge region of the straight PN-junction portions g and h is considerably thicker than that of the convex corners a to f. For this reason, the electric field at the convex corners a to f becomes concentrated. As a result, an avalanche breakdown will occur at these convex corners earlier than at the straight PN-junction portions g and h. In other words, the breakdown voltage of the resistor region 3 is determined by the breakdown voltage at its convex corners. This implies that the breakdown voltage of a monolithic IC having a resistor region is determined by the convex corners of the resistor region. Though the other electrode contact region 7' also has corners, the reverse-bias voltage across the PN-junction at these corners is not so intense, as described above. Therefore, the lowering of the breakdown voltage at the convex corners of the region 7' does not come into question.

In order to prevent the lowering of the breakdown voltage at the convex corners, three countermeasures described hereinafter have been adopted. One of the countermeasures is to deeply form the P-type regions for the resistor region 3 and the electrode contact regions 7 and 7'. However, the resistor region 3 is ordinarily formed simultaneously with other regions such as the base regions of NPN transistors, and therefore such base regions also become deeper. Consequently, not only the deterioration of the high frequency characteristic of the transistor is brought about, but also an increase in an element area results. Forming base regions and resistor regions in separate steps will not raise the above problem, but the manufacturing steps are increased.

Figure 2:
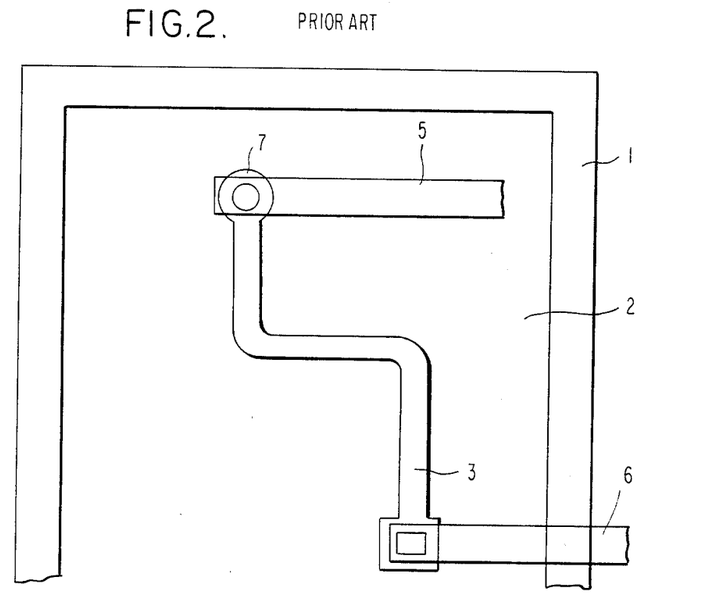
FIG. 2 is plan view showing a resistor region provided according to a countermeasure proposed in the prior art for enhancing the breakdown voltage.

A second countermeasure is to round the convex corners a to f of the PN-junction to increase their radii of curvature, as shown in FIG. 2. However, it is complicated to calculate resistance values at the contact region 7 and at the rounded convex corners of the resistor region 3. Moreover, it is difficult to form convex corners having smooth curvatures. Therefore, this countermeasure is not favorable.

Figure 3:
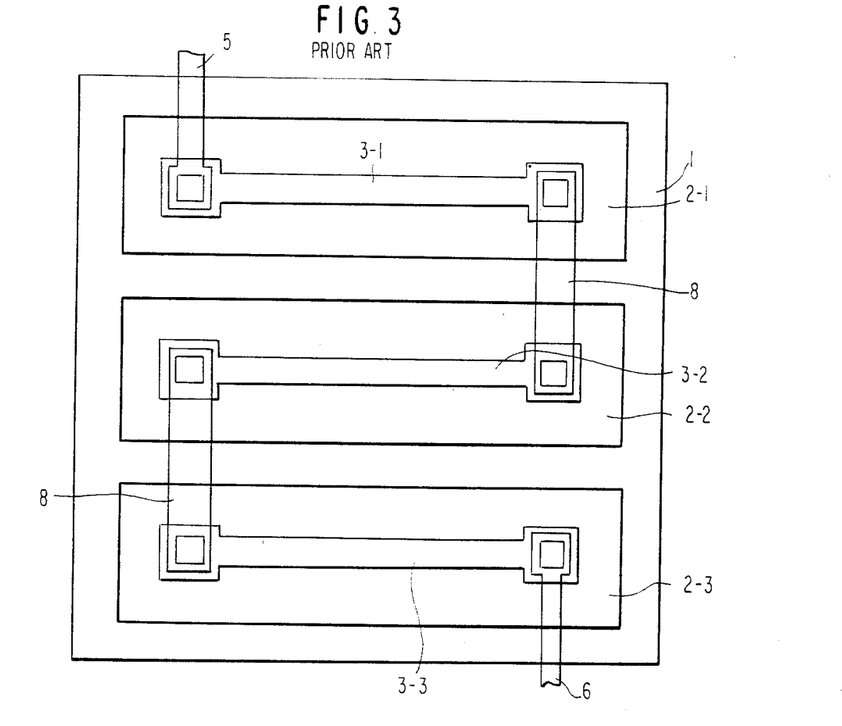
FIG. 3 is a plan view showing a resistor region provided according to another countermeasure proposed in the prior art for enhancing the breakdown voltage.

A third countermeasure is to divide the resistor region 3 into a plurality of partial resistor regions, for example, three resistor regions 3-1, 3-2 and 3-3, as shown in FIG. 3. The resistor regions are formed in the island regions 2-1, 2-2 and 2-3 isolated by the isolation region 1, respectively, and are connected in series through interconnection conductors 8. The island regions are not supplied with any bias voltage, whereby they are held in a floating condition. Therefore, the reverse-biase voltages across the respective P-N junctions between the resistor regions and the island regions are reduced to $\frac{1}{3} V_{cc}$ ($V_{cc}$ being a power supply voltage). However, the area occupied by the resistor by this countermeasure is increased, and freedom in the pattern layout is lost.

DETAILED DESCRIPTION OF THE PREFERRED EMBODIMENTS

Figure 4:
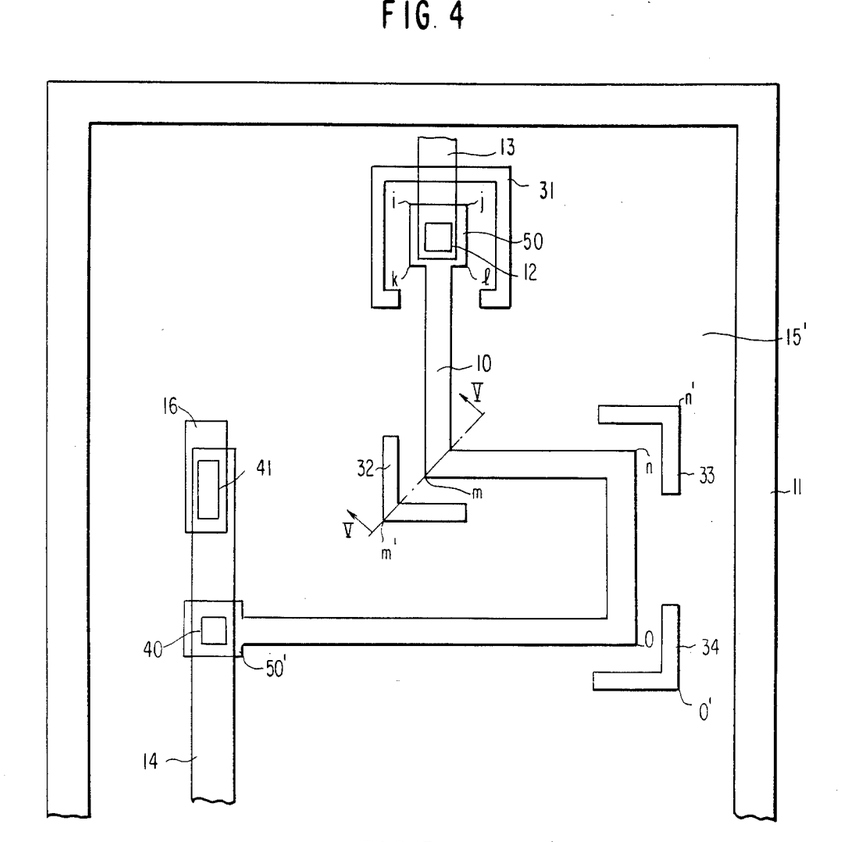
FIG. 4 is a plan view showing a resistor region according to a first embodiment of the present invention.
Figure 5:
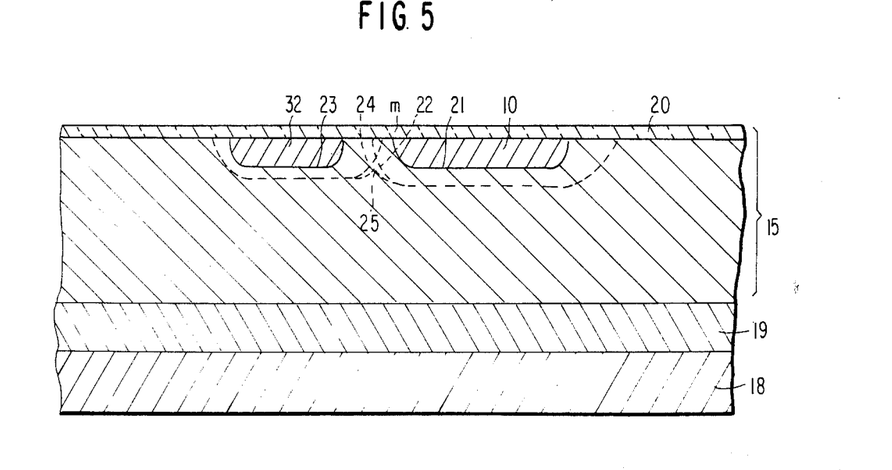
FIG. 5 is a cross-section view taken along line V—V in FIG. 4.

Referring now to FIGS. 4 and 5, a first embodiment of the present invention will be described. An N-type epitaxial layer 15 is formed on a P-type substrate 18 in which an N-type buried region 19 and P-type buried region (not shown) serving as an insulation region are selectively formed. The N-type epitaxial layer 15 has a resistivity of 10 to 15 Ω-cm and a thickness of 25.7 to 29.0 μm. A P-type impurity is introduced into the epitaxial layer 15 to form a P-type insulation region 11 having a sheet resistance of 7.5 Ω/□ and a depth of 20 μm. The insulator region 11 is connected to the P-type buried region formed in the substrate 18. Consequently, the insulation region 11 isolates the epitaxial layer 15 into a plurality of island regions. A P-type impurity is introduced into one island region 15' simultaneously with the formation of a base of an NPN transistor in order to form a resistor region 10 having a sheet resistance of 250 Ω/□ and a depth of 3.0 μm. Electrode contact regions 50 and 50' are provided at both ends of the resistor region 10, respectively. The resistor region 10 is bent three times at a right angle between the electrode contact regions in order to obtain the required resistor length. Therefore, the resistor region has three convex corners m, n, and o. The electrode contact region 50 has four convex corners i, j, k, and l, and the other electrode contact region 50' also has four convex corners. Though these convex corners i to o are formed at a right angle on a mask pattern, they have some roundness in practice due to the lateral expansion of impurities. However, their radii of curvature are extremely small.

An aluminum conductor 13 is provided on the electrode contact region 50 through a contact window 12 formed by selectively removing a surface insulating film 20. The conductor 13 is supplied with a potential of 1 V. An aluminum conductor 14 is connected to the other electrode contact region 50' via a contact window 40. The conductor 14 is supplied with a power supply voltage $V_{cc}$ of 100 V, and is further connected via a contact window 41 to a high concentration region 16 of the same N-type as the island region 15' in order to bias the region. Accordingly, the reverse-bias voltage applied across the PN-junction in the electrode contact region 50' is small, but the PN-junctions in the electrode contact region 50 and in the register region 10 close to this region 50 are held in an intensely reverse-biased condition.

For the purpose of enhancing the breakdown voltages at the convex corners of the P-type regions 10 and 50, additional P-type regions 31 to 34 are formed in the island region 15'. The regions 31 to 34 are juxtaposed with the convex corners i to o with the distance from the corners being selected such that the space charge region (depletion layer) expanding from a straight PN-junction portion associated with the convex corners of the resistor region 10 can reach the respective regions 31 to 34. In other words, the distances are shorter than the lengths of the space charge regions expanding from the straight PN-junction portions when the convex corners i to o are subjected to an avalanche breakdown. The P-type region 31 disposed proximate the convex corners i to l of the contact region 50 is formed to substantially enclose the contact region, while the P-type regions 32 to 34 are disposed outside the respective convex corners m to o with similar corners m' to o'.

These P-type regions 31 to 34 are formed simultaneously with the formation of the resistor region 10 and the contact regions 50 and 50', and are held in a floating condition without any voltage being applied.

Referring also to FIG. 5, when a power supply is switched on for starting a circuit operation, a space charge region (depletion layer) 22 extends from a PN-junction 21 between the resistor region 10 and the island region 15' laterally into the epitaxial layer 15. The extent of the space charge region 22 becomes larger as the power supply voltage $V_{cc}$ is increased. The distance between the region 32 and the convex corner m of the resistor region 10 is selected to be such that the space charge region expanding from the straight PN-junction portion associated with the convex corner m can reach the region 32 and the space charge region from the region 32 can reach the space charge region from the convex corner m. Therefore, the space charge region (not shown in FIG. 5) from the straight portion in plan view of a PN-junction near the convex corner m reaches the P-type region 32 before any breakdown occurs at the convex corner m, whereby the potential of the space charge region is applied to the region 32. As a result, the PN-junction 23 between the P-type region 32 and the N-type island region 15' is also reverse-biased, so that a space charge region 24 of this PN-junction 23 expands from the region 32 into the island region 15'. The space charge region 24 from the concave corner of the region 32 expands more widely and contacts the space charge region 22 from the convex corner m which is thinner than that from the straight PN-junction portion. Accordingly, the overall spaced charge region extending from the convex corner m is a composite region 25 which represents the addition of the space charge regions 22 and 24. In other words, owing to the effect of the P-type region 32 juxtaposed along the convex corner m of the resistor region 10, the space charge region expanding from the convex corner m is elongated far beyond the thin space charge region from the corner m which would otherwise result. Therefore, the electric field concentration at the convex corner m is greatly mitigated, and its breakdown voltage is correspondingly enhanced. Likewise, the breakdown voltages at the other convex corners i to l, n and o are also increased by the regions 31, 33, and 34.

The distance between a region 31, 32, 33 or 34 and the convex corner of the resistor region 10 can take any value as long as the space charge region from the straight PN-junction portion reaches the region before an avalanche breakdown occurs at the convex corner. If the selected distance is close to the length of the space charge region just before the occurrence of an avalanche breakdown, the space charge region from the straight PN-junction can still reach the P-type region just prior to the occurrence of an avalanche breakdown. For this reason, the effect of extending the space charge region at the convex corner by means of the P-type regions 31 to 34 is small. On the other hand, if the selected distance is too short, the space charge region extending from the straight PN-junction portion would almost immediately reach the P-type region 17, in which case the effect of extending the space charge region is also small. From the above-mentioned viewpoints, it is favorable that the distance between the P-type regions 31 to 34, and the convex corner of the resistor region 10 is selected to be $\frac{1}{3}$ to $\frac{2}{3}$ times the distance of the maximum space charge region expansions from the convex corners in the case where the P-type regions 31 to 34 are not provided. The distance of the maximum space charge region expansion is varied by the reverse-bias voltage across the PN-junction, the resistivity of the island region 15', and the like. In the illustrated embodiment, the voltage applied to the island region is 100 V and its resistivity is 10 to 15 Ω-cm, and therefore 10 μm was selected as the distance between the corner and the regions 31 to 34. This distance is equivalent to about ½ of the above-described maximum distance. Owing to the formation of the P-type regions 31 to 34, a breakdown voltage of the resistor region 10 of about 120 V was obtained under the above-mentioned conditions. In the case where the regions 31 to 34 were not present, the breakdown voltage was 90 to 100 V, and hence a power supply voltage of 100 V could not be applied to the monolithic IC including the resistor region 10. In other words, an enhancement of the breakdown voltage of 20 to 30 V was realized.

The region 31 opposite the convex corners i to l may be omitted by forming the contact region 50 in such a shape as described below. The convex corners i and j do not directly contribute to the resistance value of the resistor, and may therefore be rounded with a relatively large radius of curvature. On the other hand, the convex corners k and l have an influence on the resistance value, and therefore they cannot be so rounded. However, the space charge regions from these corners can be further extended by the space charge regions from the straight PN-junction portions v and w of the resistor region 10 near the contact region 50 because the width of the region 50 is only slightly larger than that of the resistor region 10. Accordingly, the electric field concentration at the corners k and l is mitigated. In addition, by forming a contact region 50 having the same width as the resistor region 10, the convex corners k and l are not produced. Thus, the region 31 can be omitted by forming the contact region 50 in a specific manner.

Figure 6:
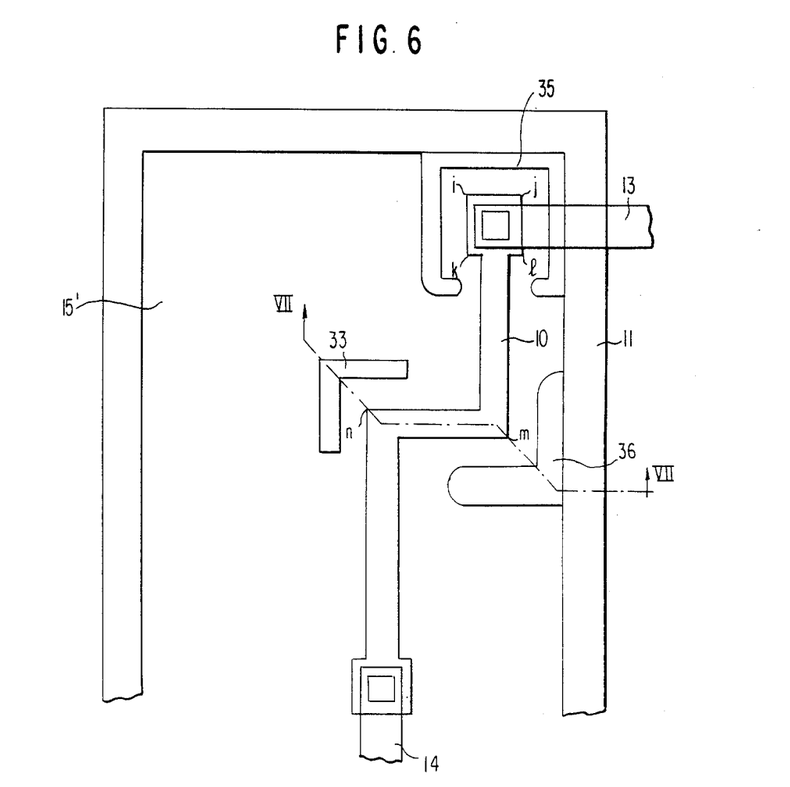
FIG. 6 is a plan view showing a resistor region according to a second embodiment of the present invention.
Figure 7:
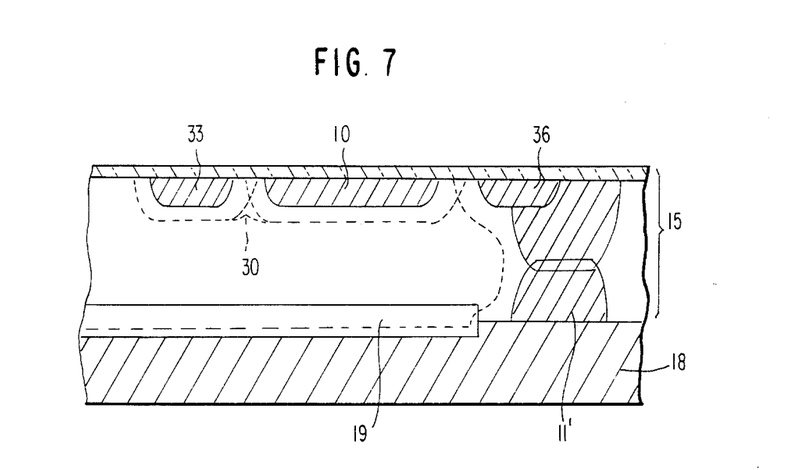
FIG. 7 is a cross-section view taken along line VII—VII in FIG. 6.

A second embodiment of the present invention is illustrated in FIGS. 6 and 7, in which parts similar to those shown in FIGS. 4 and 5 are given like reference numerals, whose further description will be omitted. In this embodiment, a P-type buried layer 11' for forming an isolation region in cooperation with the region 11 is shown. The main difference between this embodiment and that of FIGS. 4 and 5 is that P-type regions 35 and 36 for mitigating the electric field concentration at the convex corners i to m of the resistor region 10 are disposed in contact with the isolation region 11 by reason of the resistor region being located near to the isolation region. The effect of enhancing the breakdown voltage of the resistor region 10 in this manner will be readily understood from FIG. 7, which shows a cross-section taken along line B—B' in FIG. 6. In FIG. 7, space charge region 30 from the resistor region 10 is elongated farther than the space charger region upon an avalanche breakdown. Furthermore, because the P-type regions 35 and 36 make contact with the isolation region 11, the area occupied by the resistor element according to this embodiment can be made smaller than that according to the first embodiment. It is to be noted that since the isolation region 11 is biased at the lowest potential, the reverse-biasing voltage of $V_{cc}$ is applied between the P-type regions 35, 36 and 33 and the island region 15'. Therefore, in order to prevent the convex corners of the P-type regions 35 and 36 from being subjected to an avalanche breakdown due to the electric field concentration, they are rounded to reduce their curvatures. In this case, the P-type regions 35 and 36 are not resistor regions, and therefore the problem arising upon rounding the convex corners of the resistor region 10, as described previously with reference to FIG. 2, does not occur.

One might consider that a punch-through phenomenon would occur because the space charge region expanding from the resistor region 10 and that expanding from the P-type regions 35 and 36 make contact with each other. However, the N-type island region 15' is biased by the power supply voltage $V_{cc}$. Therefore, so long as the space charge region expanding from the resistor region 10 does not arrive at the P-type regions 35 and 36 by overcoming the space charges thereof, no punch-through will occur. Hence, there is no influence on the voltage applied to the resistor region 10.

Figure 8:
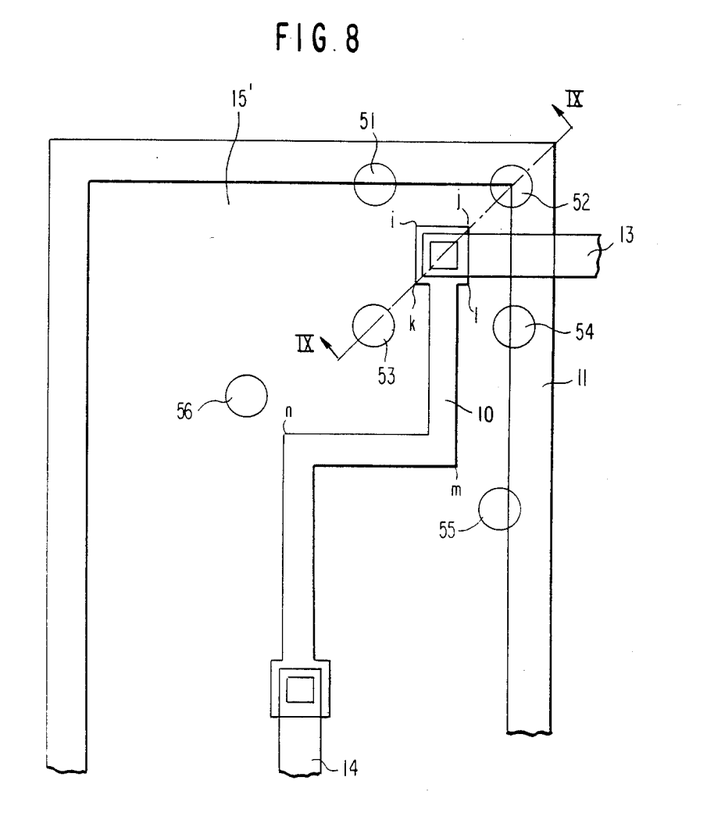
FIG. 8 is a plan view showing a resistor region according to a third embodiment of the present invention.
Figure 9:
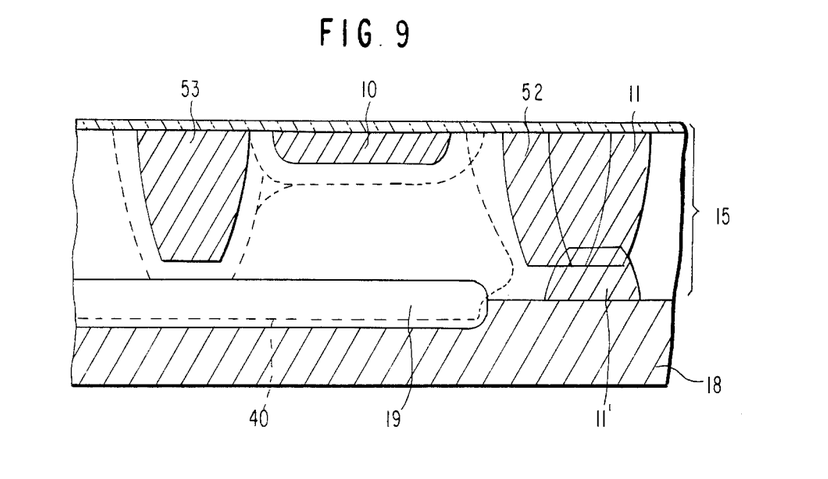
FIG. 9 is a cross-section view taken along line IX—IX in FIG. 8.

A third embodiment of the present invention is illustrated in FIGS. 8 and 9, in which regions 51 to 56 are provided radially outwardly from the convex corners i to n of the resistor region 10 and are formed as deep p+-type regions by the diffusion effected simultaneously with the formation of the isolation region 11. The regions 51 to 56 have deep junction depths as seen in FIG. 9, and therefore, the expansion of the space charge region from the resistor region 10 becomes larger as shown by numeral 40. Accordingly, the resistor according to this embodiment is suitable for an IC which is required to have a breakdown voltage 20 to 30 V higher than that of the IC structure shown in FIGS. 4 and 5. The P-type regions 51 to 56 are formed circularly, and therefore the space charge region from the straight PN-junction portion of the resistor region 10 will not reach them. Accordingly, the respective distances between the regions 51 to 56 and the convex corners i to n is selected such that the space charge regions from the convex corners reaches the circular regions.

As described in detail above, the present invention enhances the breakdown voltage of a resistor element whose PN-junction is back-biased by a high voltage, such as a power supply voltage. This advantage is attained without any increase in manufacturing steps, any complicated calculation of the resistance value, or any increase in the area occupied by the resistor region.

Though the above embodiments show only one resistor region, the present invention can be also applied to a semiconductor device having two or more resistor regions formed in one island region. In this case, one P-type region for enhancing a breakdown voltage could be commonly used for a plurality of resistor regions. Furthermore, the present invention is equally applicable to IC's having interchanged conductivity types, and to resistor regions in MOS-type IC's. Further, the configurations of the resistor regions and the regions provided for increasing the breakdown voltage are not limited to the illustrated shapes.

What is claimed is:

1. A semiconductor device, comprising: a semiconductor layer of one conductivity type, an isolation region of the opposite conductivity type electrically separating said semiconductor layer into a plurality of island regions, a resistor region of opposite conductivity type formed in one island region, said one island region being supplied with a bias potential to reverse-bias said resistor region, said resistor region being elongated and bent at least once in a plan view to form a convex corner associated with a pair of straight P-N junction portions, said resistor region having one end portion supplied with a first potential and the other end portion supplied with a second potential higher than said first potential to produce a voltage drop along said resistor region, said voltage drop causing a reverse-bias voltage applied to one of said straight P-N junction portions to be larger than a reverse-bias voltage applied to the other of said straight P-N junction portions, and at least one additional region of said opposite conductivity type formed in said one island region adjacent to said convex corner and having a first arm extending partially along said one of said straight P-N junction portions and a second arm extending partially along said other of said straight P-N junction portions, said additional region being positioned at a distance from said convex corner such that at least one part of a space charge region extending from said one of said straight P-N junction portions reaches at least one portion of said first arm of said additional region before an avalanche breakdown occurs at said convex corner.

2. The semiconductor device as claimed in claim 1, wherein said additional region has a depth substantially equal to a depth of said resistor region.

3. The semiconductor device as claimed in claim 1, wherein said additional region is in contact with said isolation region.

* * * * *